United States Patent [19]

Osawa

[11] Patent Number: 5,236,631
[45] Date of Patent: Aug. 17, 1993

[54] RUBBER COMPOSITION FOR ANISOTROPICALLY ELECTROCONDUCTIVE MEMBRANE

[75] Inventor: Yasuhisa Osawa, Gumma, Japan
[73] Assignee: Shin-Etsu Chemical Co., Ltd., Tokyo, Japan
[21] Appl. No.: 828,255
[22] Filed: Jan. 30, 1992

[30] Foreign Application Priority Data

Jan. 31, 1991 [JP] Japan .................................. 3-031987

[51] Int. Cl.$^5$ .......................... H01B 1/00; H01B 1/20
[52] U.S. Cl. .................................... 252/512; 252/502; 252/506; 252/511; 252/518; 252/513
[58] Field of Search ............... 252/502, 503, 510, 511, 252/512, 518, 506, 513; 524/401, 439, 440

[56] References Cited

U.S. PATENT DOCUMENTS 4,482,476  11/1984  Yoshimura et al. ................. 252/511
4,534,889  8/1985   van Konyenburg et al. ....... 252/511
4,655,963  4/1987   Koga et al. ......................... 252/511
4,701,279  10/1987  Kawaguchi et al. ............... 252/511

Primary Examiner—Paul Lieberman
Assistant Examiner—M. Kopel
Attorney, Agent, or Firm—Millen, White, Zelano, & Branigan

[57] ABSTRACT

An anisotropically electroconductive rubbery membrane having good adhesiveness can be obtained from a composition comprising: (a) 100 parts by volume of a rubbery fluorocarbon polymer capable of being cross-linked with an organic peroxide compounded with from 0.1 to 30% by weight of an organosilicon compound having, in a molecule, at least one epoxy group, e.g., 3-glycidyloxypropyl trimethoxy silane, to form a continuum of matrix phase; and (b) from 1 to 30 parts by volume of electroconductive particles uniformly dispersed in the matrix phase.

7 Claims, No Drawings

RUBBER COMPOSITION FOR ANISOTROPICALLY ELECTROCONDUCTIVE MEMBRANE

BACKGROUND OF THE INVENTION

The present invention relates to a rubber composition suitable as a material of an anisotropically electroconductive membrane or, more particularly, to a rubber composition suitable as a material of an anisotropically electroconductive membrane having excellent flexibility and high heat resistance. The invention also relates to an anisotropically electroconductive membrane shaped from the composition.

An anisotropically electroconductive membrane is a sheet consisting of a polymeric material as the matrix and electroconductive fine particles dispersed therein and serves by being sandwiched between two arrays of electrodes each on an electronic device such as LSIs, liquid-crystal display panels and the like for electrically connecting the oppositely facing electrodes on both sides keeping insulation between adjacent electrodes on the same side. By virtue of simplicity of the assembling works of an electronic instrument, more and more electronic instruments are being assembled by using anisotropically electroconductive membranes. It is also desirable that an anisotropically electroconductive membrane has good adhesiveness to serve as an adhesive layer for adhesively bonding two electronic elements on both sides.

Most conventionally, anisotropically electroconductive membranes are prepared from a composition comprising a thermoplastic resin and fine metal particles dispersed in the polymeric matrix. These thermoplastic resin-based anisotropically electroconductive membranes are not quite satisfactory in respect of the relatively low heat resistance and poor adhesiveness. Alternatively, thermosetting resin-based compositions are proposed as a material of anisotropically electroconductive membranes (see, for example, Japanese Patent Kokai No. 61-195569, No. 62-271273 and No. 63-316885). The thermosetting resin-based anisotropically electroconductive membranes, however, are disadvantageous because the heat resistance thereof is not high enough to durably withstand the temperature of molten solder alloy used in the assemblage work of electronic instruments and the storage stability of thermosetting resins is usually not high enough to cause a difficulty in ensuring a constant curing velocity at a specified curing temperature.

It would be a possible way to improve an anisotropically electroconductive membrane relative to the heat resistance against molten solder alloys and storage stability by using, as the matrix polymer, a rubbery fluorocarbon polymer well known to be heat-resistant and flexible at room temperature. Conventional rubbery compositions based on a fluorocarbon polymer, however, are not very satisfactory for the purpose because good storage stability and good curability are inconsistent with each other sot that a fluorocarbon polymer-based rubbery composition having good curability is usually not fully stable in storage and vice versa. A fluorocarbon polymer-based rubbery composition compounded with an organic peroxide as a curing agent in place of an amine compound or polyol compound may have good curability along with excellent storage stability but such a composition has no adhesiveness so that anisotropically electroconductive membranes as desired cannot be prepared from such a composition.

SUMMARY OF THE INVENTION

The present invention accordingly has an object to provide a novel and improved polymeric composition for anisotropically electroconductive membranes and an anisotropically electroconductive membrane shaped from the composition, by which the above described various problems and disadvantages in the prior art compositions and membranes are dissolved.

Thus, the polymeric composition suitable as a material of an anisotropically electroconductive membrane of the invention is a rubbery fluorocarbon polymer-based composition as a blend which comprises:

(a) 100 parts by volume of a rubbery fluorocarbon polymer capable of being crosslinked with an organic peroxide compounded with from 0.1 to 30% by weight of an organosilicon compound having, in a molecule, at least one epoxy group to form a continuum of matrix phase; and (b) from 1 to 30 parts by volume of electroconductive particles uniformly dispersed in the matrix phase.

The anisotropically electroconductive membrane of the invention is accordingly a sheet shaped from the above defined polymeric composition.

DETAILED DESCRIPTION OF THE PREFERRED EMBODIMENTS

As is described above, the rubbery composition of the invention is characterized by the unique formulation of the component forming the matrix phase which consists of a rubbery fluorocarbon polymer susceptible to crosslinking with an organic peroxide as a curing agent compounded with a specific organosilicon compound to serve as an adhesion-promoting agent.

The rubbery fluorocarbon polymer as the principal ingredient of the component (a) as the matrix phase is a copolymer of high fluorine content having rubbery elasticity consisting of vinylidene fluoride and one or more kinds of monomers selected from hexafluoropropylene, pentafluoropropylene, trifluoroetrhylene, trifluorochloroethylene, tetrafluoroethylene, vinyl fluoride, perfluoro-(methyl vinyl ether), perfluoropropyl vinyl ether and the like, of which particularly preferable are binary copolymers of vinylidene fluoride and hexafluoropropylene and ternary copolymers of vinylidene fluoride, tetrafluoroethylene and hexafluoropropylene.

In view of the balance as mentioned above between good curability by heating and good stability in storage, the rubbery fluorocarbon polymer should preferably be crosslinked with an organic peroxide so that the polymeric composition as the component (a) is admixed with one kind or more of organic peroxides as a curing agent. Examples of suitable organic peroxides include dibenzoyl peroxide, dicumyl peroxide, di-tert-butyl peroxide, tert-butylperoxy acetate, tert-butylperoxy benzoate, 2,5-dimethyl-2,5-di-tert-butylperoxy hexane and the like though not particularly limitative thereto. The amount of the organic peroxide is in the range from 1 to 20% by weight or, preferably, from 2 to 10% by weight based on the rubbery fluorocarbon polymer. When the amount of the organic peroxide is too small, no full curing of the composition can be obtained as a matter of course. When the amount thereof is too large, on the other hand, difficulties are encountered in the compounding work of the rubbery composition along with a decrease in the mechanical strengths of the rubber after curing.

Though optional, the rubbery fluorocarbon polymer-based composition as the component (a) can be admixed with a vulcanization accelerator such as glycerin diallyl ether, triallyl phosphate, diallyl adipate, diallyl melamine, triallyl isocyanurate, triallyl cyanurate and the like in order that the advantage obtained by the peroxide curing can be more fully exhibited. The amount of the vulcanization accelerator, if added, is in the range from 1 to 20% by weight or, preferably, from 2 to 10% by weight based on the rubbery fluorocarbon polymer.

The other essential ingredient in the rubbery fluorocarbon polymer-based composition as the component (a) is an organic or, preferably, organosilicon compound having, in a molecule, at least one epoxy group which serves to impart adhesiveness to the composition. Examples of suitable epoxy-containing organosilicon compounds include so-called carbon-functional organosilanes such as 3-glycidyloxypropyl trimethoxy silane, 3-glycidyloxypropyl triethoxy silane, 3-glycidyloxypropyl methyl dimethoxy silane, 2-(3,4-epoxycyclohexyl)ethyl trimethoxy silane, 3-glycidyloxypropyl dimethyl ethoxy silane and the like as well as epoxy-modified organopolysiloxanes.

The amount of the epoxy-containing organosilicon compounds in the component (a) is in the range from 0.1 to 30% by weight or, preferably, from 1 to 20% by weight based on the amount of the rubbery fluorocarbon polymer. When the amount of the epoxy-containing organosilicon compound is too small, no full adhesiveness can be exhibited by the composition while, when the amount is too large, difficulties are encountered in the compounding work of the ingredients with the adhesiveness of the composition rather decreased.

The component (b), which forms a dispersed phase in the matrix phase of the above described rubbery fluorocarbon polymer-based composition, is a powder of electroconductive fine particles. The material of the electroconductive fine particles typically includes carbon, e.g., graphite, and metals such as silver, copper, nickel and the like. Alternatively, electroconductive fine particles can be prepared by providing particles of a non-electroconductive and heat-resistant material such as glass, ceramics, heat-resistant resins and the like with an electroconductive coating such as metal plating. The particles should have an average particle diameter in the range from 5 to 200 μm or, preferably, from 10 to 100 μm. When the electroconductive fine particles are too fine, no good electroconductivity can be ensured through the anisotropically electroconductive membrane shaped from the composition between opposite electrodes while, when the particles are too coarse, there can be a trouble of short-circuiting between adjacent electrodes when the electrodes in an array are arranged at a very fine pitch leaving only a very narrow gap space between adjacent electrodes. Further, the particle size distribution of the electroconductive fine particles should be as uniform as possible since, when the particle size distribution covers a wide range, the electrical conduction between opposite electrodes is established only through the particles of larger diameters leaving smaller particles futile.

The amount of the electroconductive fine particles as the component (b) in the inventive composition is in the range from 1 to 30 parts by volume or, preferably, from 2 to 20 parts by volume per 100 parts by volume of the matrix phase, i.e. the component (a). When the amount of the electroconductive fine particles is too small, no good electroconductivity can be obtained in the composition or in the anisotropically electroconductive membrane shaped therefrom as a matter of course. When the amount of the conductive particles is too large, on the other hand, the membrane shaped from the composition would have poor mechanical properties and sometimes causes a trouble of short-circuiting between adjacent electrodes to be insulated.

The electroconductive composition of the invention can be prepared by uniformly compounding a rubbery fluorocarbon polymer, epoxy-containing organosilicon compound, organic peroxide and powder of electroconductive fine particles each in a specified amount. Besides the above named ingredients, the composition can optionally be admixed with various kinds of known additives such as fillers, acid acceptors, plasticizers and the like. Examples of suitable fillers include carbon black, alumina, silica, clay, calcium carbonate, titanium dioxide, powders of poly(tetrafluoroethylene) resins and the like. It should be noted that the particle size of these additive fillers should be smaller than that of the electroconductive fine particles in order not to unduly disturb electrical connection through the electroconductive particles. When added, the amount of these additive fillers should not exceed 60% by weight based on the rubbery fluorocarbon polymer.

Examples of suitable acid acceptor include magnesium oxide, calcium oxide, calcium hydroxide, barium stearate, sodium stearate, lead oxide and the like. The amount of these acid acceptors, when added, should not exceed 20% by weight based on the rubbery fluorocarbon polymer.

The plasticizer mentioned above serves to improve the workability of the composition in the preparation of an anisotropically electroconductive membrane from the composition so that it is important that the plasticizer has good compatibility with the rubbery fluorocarbon polymer. Examples of suitable plasticizers in this regard include fluorocarbon compound-based oils and greases prepared therefrom and fatty acid esters. The amount of these plasticizers, when added, should not exceed 30% by weight based on the rubbery fluorocarbon polymer.

The compounding work of the above described essential and optional ingredients can be performed by using a conventional rubber-processing blending machine such as two-roller mills, kneaders, pressurizable kneaders, Banbury mixers and the like without particular limitations. It is important to avoid undue increase in the temperature and attritive breaking of the electroconductive particles in the compounding work. It is sometimes advantageous in this regard that the composition under milling is diluted by the addition of a small amount of an organic solvent, such as acetone, methyl ethyl ketone and the like, in order to decrease the shearing force produced in the compounding work though accompanied by a disadvantage that the organic solvent must be completely removed from the anisotropically electroconductive membrane subsequently by evaporation.

The thus prepared rubbery fluorocarbon polymer-based composition can be shaped into a sheet or film to serve as an anisotropically electroconductive membrane by a known method. When the thickness of the desired sheet is relatively large to be 100 μm or larger, a convenient method for shaping is the calendering method by using calendering rollers. A more versatile method is the casting method which is applicable to the preparation of a thin film or sheet having a thickness ranging from 10 μm to 300 μm. Namely, the composition is dissolved or dispersed in an organic solvent such as acetone, methyl ethyl ketone and the like and the solution or dispersion is cast on a flat surface of a substrate followed by evaporation of the solvent.

In the following, the electroconductive composition and anisotropically electroconductive membrane of the invention are illustrated in more detail by way of examples and comparative examples, in which the term of "parts" always refers to "parts by weight" if not otherwise mentioned. Following is a description of the procedures of the testing methods for the adhesiveness, electroconductivity and electrical insulation of the membranes given in the examples and comparative examples.

Adhesiveness

The anisotropically electroconductive membrane under testing was sandwiched between a stainless steel plate of 25 mm width and a polyimide resin film and they were bonded together by heating at 190° C. for 3 minutes under a load of 3 kg/cm² with the membrane as interposed. After cooling to room temperature, the resistance against peeling of the polyimide resin film from the membrane was measured by pulling in a direction of 180° using an automatic tensile tester.

Electroconductivity

The anisotropically electroconductive membrane was sandwiched between two polyimide films each provided on one surface with an array of electrodes of a gold-plated copper foil each having a width of 0.4 mm and arranged at a pitch of 0.8 mm to contact with the anisotropically electroconductive membrane by heating at 190° C. for 3 minutes under a load of 3 kg/cm² and the electroconductivity was measured between two oppositely facing electrodes.

Insulation between adjacent electrodes

The same arrangement as above was used to determine the insulating resistance between two adjacent electrodes on the same polyimide resin film.

EXAMPLES 1 to 8

An anisotropically electroconductive membrane having a thickness of 200 μm and a specific gravity of 1.73 g/cm³, referred to as the Sample No. 1 hereinbelow, was prepared, in Example 1, by sheeting from a composition obtained by blending and kneading, on a two-roller mill, 100 parts of a fluorocarbon rubber (Daiel G801, a product by Daikin Co.) with 5 parts of 3-glycidyloxypropyl trimethoxy silane 3.4 parts of electroconductive particles having a density of 0.68 g/cm³ (Sho-balloon BS Metallite AG-SF20, a product by Showa Denko Co.) 3 parts of 2,5-dimethyl-2,5-di(tert-butylperoxy) hexane (Perhexa 2-5B, a product by Nippon Oils and Fats Co.) as a curing agent, 4 parts of triallyl isocyanurate as a vulcanization accelerator (Taique, a product by Nippon Kasei Co.), 10 parts of a fumed silica filler (Aerosil 200, a product by Nippon Aerosil Co.), 5 parts of an oily copolymer of vinylidene fluoride and hexafluoropropylene (Daiel G101, a product by Daikin Co.) as a plasticizer and 1 part of calcium hydroxide followed by heating of the membrane to effect curing.

In Example 2, a second anisotropically electroconductive membrane having a thickness of 200 μm and a specific gravity of 1.67 g/cm³, referred to as the Sample No. 2 hereinbelow, was prepared in the same manner as above excepting omission of the silica filler, plasticizer and calcium hydroxide and, instead, addition of 10 parts of MT carbon black (Thermax MT, a product by Haber Co.).

In Example 3, a third anisotropically electroconductive membrane having a thickness of 200 μm and a specific gravity of 1.72 g/cm³, referred to as the Sample No. 3 hereinbelow, was prepared in the same manner as in the preparation of the Sample No. 1 excepting increases in the amount of the 3-glycidyloxypropyl trimethoxy silane to 10 parts, the amount of the electroconductive particles to 6.9 parts, the amount of the curing agent to 4 parts and the amount of the silica filler to 20 parts, and replacement of the calcium hydroxide with the same amount of magnesium oxide.

In Example 4, a fourth anisotropically electroconductive membrane having a thickness of 200 μm and a specific gravity of 1.73 g/cm³, referred to as the Sample No. 4 hereinbelow, was prepared in the same manner as in the preparation of the Sample No. 1 excepting replacement of the 3-glycidyloxypropyl trimethoxy silane with the same amount of 2-(3,4-epoxycyclohexyl)ethyl trimethoxy silane, increases of the amount of the electroconductive particles to 6.8 parts, the amount of the curing agent to 4 parts and the amount of the silica filler to 20 parts and omission of the plasticizer.

In Example 5, a fifth anisotropically electroconductive membrane having a thickness of 200 μm and a specific gravity of 1.77 g/cm³, referred to as the Sample No. 5 hereinbelow, was prepared in the same manner as in the preparation of the Sample No. 1 excepting replacement of the fluorocarbon rubber with the same amount of another fluorocarbon rubber (Viton GE, a product by Du Pont Co.) and omission of the plasticizer.

In Example 6, a sixth anisotropically electroconductive membrane having a thickness of 200 μm and a specific gravity of 1.78 g/cm³, referred to as the Sample No. 6 hereinbelow, was prepared in the same manner as in the preparation of the Sample No. 1 excepting replacements of the fluorocarbon rubber with the same amount of another fluorcarbon rubber (Viton GE, a product by Du Pont Co.) and 5 parts of the 3-glycidyloxypropyl trimethoxy silane with 10 parts of 2-(3,4-epoxycyclohexyl)ethyl trimethoxy silane, increases of the amount of the electroconductive particles at 6.8 parts, the amount of the curing agent to 4 parts and the amount of the silica filler to 20 parts, omission of the plasticizer and replacement of the calcium hydroxide with the same amount of magnesium oxide.

These anisotropically electroconductive membranes were each subjected to the measurements of the adhesiveness, electroconductivity and insulation between adjacent electrodes in the procedures described above to give the results shown in Table 1 below. These results were substantially unaltered even when the measurements were conducted after a heat treatment of the membranes at 260° C. for 10 minutes or at 50° C. for 24 hours so that it was concluded that they could withstand eventual contacting with a molten solder alloy in the assemblage works.

COMPARATIVE EXAMPLES 1 to 6

The experimental procedure in Comparative Example 1 was substantially the same as in Example 1 to prepare a seventh anisotropically electroconductive membrane having a thickness of 200 μm and a specific gravity of 1.76 g/cm$^3$, referred to as the Sample No. 7 hereinbelow, excepting omission of the 3-glycidyloxypropyl trimethoxy silane, plasticizer and calcium hydroxide in the formulation of the rubber composition.

In Comparative Example 2, an eighth anistropically electroconductive membrane having a thickness of 200 μm and a specific gravity of 1.50 g/cm$^3$, referred to as the Sample No. 8 hereinbelow, was prepared in the same manner as in the preparation of the Sample No. 7 described above except that 5 parts of 3-glycidyloxypropyl trimethoxy silane were added to the formulation of the composition and the amount of the electroconductive particles was increased to 27.2 parts.

In Comparative Example 3, a ninth anisotropically electroconductive membrane having a thickness of 200 μm and a specific gravity of 1.71 g/cm$^3$, referred to as the Sample No. 9 hereinbelow, was prepared in the same manner as in the preparation of the Sample No. 7 described above except that 0.05 part of 3-glycidyloxypropyl trimethoxy silane was added to the formulation of the composition and the amount of the electroconductive particles was increased to 6.8 parts.

In Comparative Example 4, a tenth anisotropically electroconductive membrane having a thickness of 200 μm and a specific gravity of 1.56 g/cm$^3$, referred to as the Sample No. 10 hereinbelow, was prepared in the same manner as in the preparation of the Sample No. 9 described above except that the amount of 3-glycidyloxypropyl trimethoxy silane was increased to 40 parts.

In Comparative Example 5, an eleventh anisotropically electroconductive membrane having a thickness of 200 μm and a specific gravity of 1.74 g/cm$^3$, referred to as the Sample No. 11 hereinbelow, was prepared in the same manner as in the preceding examples but the rubber composition was prepared from 100 parts of a third fluorocarbon rubber, which was not of the peroxide-vulcanizable type but of the polyol-vulcanizable type (Viton E-430, a product by Du Pont Co.), 5 parts of 3-glycidyloxypropyl trimethoxy silane, 6.8 parts of the electroconductive particles, 10 parts of the silica filler and 5 parts of calcium hydroxide.

In Comparative Example 6, a twelfth anisotropically electroconductive membrane having a thickness of 200 μm and a specific gravity of 1.77 g/cm$^3$, referred to as the Sample No. 12 hereinbelow, was prepared in the same manner as in the preparation of the Sample No. 11 described above excepting omission of the 3-glycidyloxypropyl trimethoxy silane and decrease of the amount of calcium hydroxide to 3 parts.

These comparative Samples No. 7 to No. 12 were each subjected to the same evaluation tests as in the Samples No. 1 to No. 6 to give the results shown in Table 1. As is clear from this table, the adhesiveness was very poor in Samples No. 7 and No. 12 due to the omission of the epoxy-containing organosilicon compound. The adhesiveness was poor also in Sample No. 9 because the amount of the epoxy-containing organosilicon compound was very small. The Sample No. 11 had good adhesion as prepared but the adhesiveness was completely lost after a heat treatment of the membrane at 50° C. for 24 hours. Although the Sample No. 8 had reasonably high adhesion and electroconductivity, a great difficulty was encountered in the preparation of the rubber composition necessitating addition of methyl ethyl ketone as a diluent which must be removed subsequently by evaporation and the insulation between adjacent electrodes was very unstable due to the excessively large amount of the electroconductive particles.

TABLE 1

| Sample No. | Adhesiveness, kg/25 mm | Electroconductivity, ohm | Insulation, ohm |
|---|---|---|---|
| 1 | 6.9 | 1–2 | ∞ |
| 2 | 7.0 | 1–4 | ∞ |
| 3 | 7.2 | 1–2 | ∞ |
| 4 | 6.4 | 1–2 | ∞ |
| 5 | 6.6 | 1–3 | ∞ |
| 6 | 7.0 | 1–3 | ∞ |
| 7 | 0.9 | — | — |
| 8 | 3.2 | 1–2 | 1–∞ |
| 9 | 1.0 | — | — |
| 10 | 2.2 | — | — |
| 11 | 6.5 | 1–3 | ∞ |
| 12 | 1.2 | — | — |

What is claimed is:

1. An anisotropically electroconductive membrane shaped from a rubbery fluorocarbon polymer-based composition comprising, as a blend:
   (a) a continuous matrix phase comprising: 100 parts by volume of a rubbery fluorocarbon polymer, crosslinkable with an organic peroxide, compounded with from 0.1 to 30% by weight of an organosilicon compound having, in a molecule, at least one epoxy group and compounded with 1 to 20% by weight of an organic peroxide; and
   (b) from 1 to 30 parts by volume of electroconductive particles uniformly dispersed in the continuous matrix phase;
said membrane being anisotropically electroconductive.

2. The anisotropically electroconductive membrane of claim 1 which has a thickness in the range from 10 μm to 300 μm.

3. The anisotropically electroconductive membrane of claim 1 in which the rubbery fluorocarbon polymer is a copolymer of vinylidene fluoride and hexafluoropropylene or a copolymer of vinylidene fluoride, tetrafluoroethylene and hexafluoropropylene.

4. The anisotropically electroconductive membrane of claim 1 in which the organosilicon compound having, in a molecule, at least one epoxy group is an organosilicon compound having, in a molecule, at least one 3-glycidyloxypropyl group or 2-(3,4-epoxycyclohexyl)ethyl group bonded to the silicon atom.

5. The anisotropically electroconductive membrane of claim 4 in which the organosilicon compound having, in a molecule, at least one 3-glycidyloxypropyl group is selected from the class consisting of 3-glycidyloxpropyl trimethoxy silane, 3-glycidyloxypropyl triethoxy silane, 3-glycidyloxypropyl methyl dimethoxy silane and 3-glycidyloxypropyl dimethyl ethoxy silane.

6. The anisotropically electroconductive membrane of claim 4 in which the organosilicon compound having, in a molecule, at least one 2-(3,4-epoxycyclohexyl)ethyl group is 2-(3,4-epoxycyclohexly)ethyl trimethoxy silane.

7. The anisotropically electroconductive membrane of claim 1 in which the electroconductive particles have an average particle diameter in the range of from 5 μm to 200 μm.

* * * * *